(12) United States Patent
Su et al.

(10) Patent No.: US 9,840,778 B2
(45) Date of Patent: Dec. 12, 2017

(54) PLASMA CHAMBER HAVING AN UPPER ELECTRODE HAVING CONTROLLABLE VALVES AND A METHOD OF USING THE SAME

(75) Inventors: Yen-Shuo Su, Zhubei (TW); Ying Xiao, Zhubei (TW); Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1151 days.

(21) Appl. No.: 13/486,374

(22) Filed: Jun. 1, 2012

(65) Prior Publication Data
US 2013/0319612 A1 Dec. 5, 2013

(51) Int. Cl.
C23C 16/50 (2006.01)
C23C 16/455 (2006.01)
H01J 37/32 (2006.01)
C23C 16/52 (2006.01)

(52) U.S. Cl.
CPC ........ C23C 16/50 (2013.01); C23C 16/45561 (2013.01); C23C 16/45563 (2013.01); C23C 16/45565 (2013.01); C23C 16/52 (2013.01); H01J 37/3244 (2013.01); H01J 37/32449 (2013.01); H01J 37/32532 (2013.01); H01J 37/32899 (2013.01)

(58) Field of Classification Search
CPC ... C23C 16/50; C23C 16/52; C23C 16/45561; C23C 16/45563; C23C 16/45565; H01J 37/32449; H01J 37/3244; H01J 37/32532; H01J 37/32899

USPC .......................................................... 118/715
See application file for complete search history.

(56) References Cited

U.S. PATENT DOCUMENTS 2,500,787 A * 3/1950 Lelgemann ........... F23D 11/001
431/175
3,077,306 A * 2/1963 Herzog ................... B05B 17/08
239/17

(Continued)

FOREIGN PATENT DOCUMENTS

JP 05-055172 3/1993
JP 05-217952 8/1993

(Continued)

OTHER PUBLICATIONS

Notice of Allowance dated May 20, 2014 and English translation from corresponding application No. KR 10-2012-0123054.

(Continued)

*Primary Examiner* — Jeffrie R Lund
(74) *Attorney, Agent, or Firm* — Hauptman Ham, LLP

(57) ABSTRACT

This description relates to a plasma treatment apparatus including a vapor chamber, a gas supply and an upper electrode assembly. The upper electrode assembly includes a gas distribution plate having a plurality of holes in a bottom surface thereof and an upper electrode having at least one gas nozzle and at least one controllable valve connected to the at least one gas nozzle. The plasma treatment apparatus further includes a controller configured to generate a control signal. The at least one controllable valve is configured to be adjusted based on the control signal. A control system and a method of controlling a controllable valve are also described.

20 Claims, 8 Drawing Sheets

(56) References Cited

U.S. PATENT DOCUMENTS

| | | | |
|---|---|---|---|
| 4,980,204 A * | 12/1990 | Fujii | C23C 16/455 117/101 |
| 5,496,408 A * | 3/1996 | Motoda | C23C 16/4481 118/715 |
| 5,683,517 A * | 11/1997 | Shan | C23C 16/455 118/723 E |
| 5,853,484 A | 12/1998 | Jeong | |
| 6,580,053 B1 * | 6/2003 | Voutsas | B23K 26/1435 219/121.6 |
| 7,159,599 B2 * | 1/2007 | Verhaverbeke | H01L 21/67069 134/109 |
| 2001/0020651 A1 * | 9/2001 | Imanaka | C23C 16/45563 239/587.1 |
| 2002/0058143 A1 * | 5/2002 | Hunt | C23C 16/453 428/412 |
| 2004/0154530 A1 * | 8/2004 | Hiatt | H01L 21/6704 118/50 |
| 2004/0261704 A1 * | 12/2004 | Heuken | C23C 16/52 118/715 |
| 2005/0183959 A1 * | 8/2005 | Wilson | C23C 14/545 205/123 |
| 2005/0263170 A1 * | 12/2005 | Tannous | B08B 5/02 134/1.1 |
| 2006/0157445 A1 * | 7/2006 | Mochiki | H01J 37/3244 216/59 |
| 2006/0191637 A1 * | 8/2006 | Zajac | B81C 1/00547 156/345.34 |
| 2007/0039548 A1 * | 2/2007 | Johnson | C23C 16/52 118/665 |
| 2007/0269612 A1 * | 11/2007 | Bijker | C23C 4/12 427/569 |
| 2007/0284337 A1 * | 12/2007 | Mochizuki | H01J 37/3244 216/67 |
| 2009/0026068 A1 * | 1/2009 | Hongo | B24B 37/345 204/199 |
| 2009/0255798 A1 * | 10/2009 | Furuta | C23C 16/4405 204/157.15 |
| 2010/0101727 A1 * | 4/2010 | Ji | H01J 37/32357 156/345.29 |
| 2010/0104771 A1 | 4/2010 | Kudela et al. | |
| 2010/0193471 A1 * | 8/2010 | Funk | C23C 16/4412 216/67 |
| 2010/0278999 A1 | 11/2010 | Onodera et al. | |
| 2011/0300716 A1 * | 12/2011 | Park | C23C 16/36 438/758 |
| 2011/0308453 A1 * | 12/2011 | Su | C23C 16/303 118/708 |
| 2012/0003142 A1 * | 1/2012 | Takasuka | C23C 16/4401 423/409 |
| 2012/0031336 A1 * | 2/2012 | Hsu | C23C 16/4551 118/723 R |
| 2012/0164845 A1 * | 6/2012 | Liu | H01J 37/32449 438/777 |
| 2012/0171871 A1 * | 7/2012 | Dhindsa | H01J 37/3244 438/710 |
| 2012/0220135 A1 * | 8/2012 | Nakagawa | H01L 21/31144 438/714 |
| 2012/0251705 A1 * | 10/2012 | Matsudo | G05D 23/192 427/8 |
| 2013/0319612 A1 * | 12/2013 | Su | H01J 37/32449 156/345.24 |
| 2014/0137801 A1 * | 5/2014 | Lau | C30B 25/14 118/728 |
| 2014/0339545 A1 * | 11/2014 | Yamazaki | H01L 29/24 257/43 |
| 2015/0214009 A1 * | 7/2015 | Glukhoy | H01J 37/3244 239/132.3 |
| 2015/0214013 A1 * | 7/2015 | Glukhoy | H01J 37/32449 29/527.1 |
| 2015/0325411 A1 * | 11/2015 | Godet | H01J 37/32357 216/59 |

FOREIGN PATENT DOCUMENTS

| | | |
|---|---|---|
| KR | 1997-0023689 | 5/1997 |
| KR | 10-0201386 | 6/1999 |
| TW | 200920192 | 5/2009 |
| TW | 201004493 | 1/2010 |
| TW | 201011121 | 3/2010 |
| TW | I356466 | 1/2012 |

OTHER PUBLICATIONS

Office Action dated Nov. 28, 2013 with English translation from corresponding application No. KR 10-2012-0123054.

Office Action dated Sep. 22, 2014 from corresponding application No. TW102118365.

* cited by examiner

PLASMA CHAMBER HAVING AN UPPER ELECTRODE HAVING CONTROLLABLE VALVES AND A METHOD OF USING THE SAME

BACKGROUND

Electronic devices, such as integrated circuits and flat panel displays, are commonly fabricated by a series of process steps in which layers are deposited on a substrate and the deposited layers are etched into desired patterns. In some instances, the process steps include plasma enhanced chemical vapor deposition (PECVD) processes. The trend in microelectronic circuits toward ever increasing densities and smaller feature sizes continues to make plasma processing of such devices more difficult. For example, in single wafer systems, pressure differences and differences in treatment gas concentration leads to non-uniformities across a surface of a wafer substrate, from a center of the wafer substrate to an edge of the wafer substrate. The non-uniformities become more pronounced as a diameter of the wafer substrate increases. Such non-uniformities cause a variety of problems. For example, in the manufacture of semiconductors and integrated circuits, such non-uniformities often result in devices that either do not function or function in a decreased capacity.

Previous techniques utilized different gas distribution plates or focus rings for substrates having different diameters in order to compensate for non-uniformities of the treatment gas. Identifying and installing the correct gas distribution plate or focus ring is time consuming and costly. In addition, the appropriate gas distribution plate for a particular process is often not suitable for a different process. Consequently, in order to use the same chamber for different processes, the gas distribution plate is replaced which decreases an amount of time the chamber is operating, thereby reducing a production yield. In addition, in gas distribution plates which provide concentric control of treatment gas flow, the non-uniformity of the wafer surface is increased.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

Figure 1:
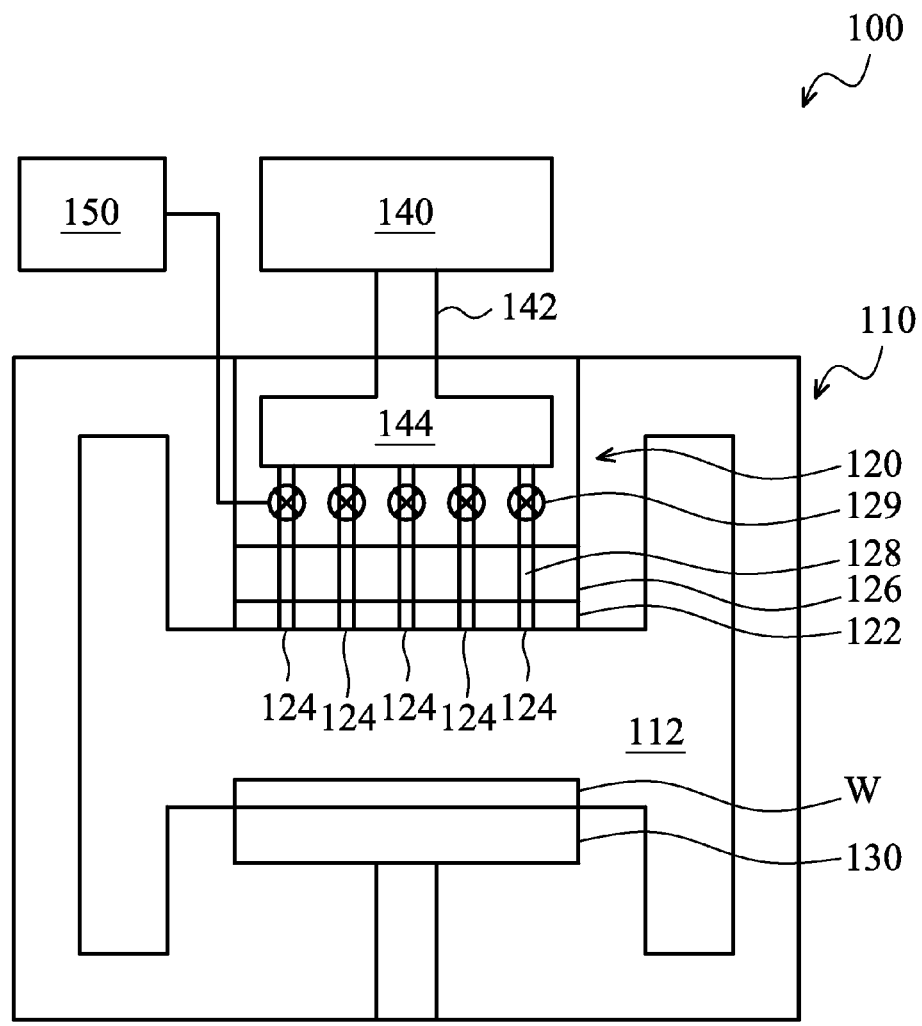
FIG. 1 is a cross-sectional view of a plasma treatment apparatus in accordance with at least one embodiment.

It is understood that the following disclosure provides many different embodiments, or examples, for implementing different features of the present application. Specific examples of components and arrangements are described below to facilitate the illustrations presented in the present disclosure. These are, of course, examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a cross-sectional view of a plasma treatment apparatus 100. Plasma treatment apparatus 100 includes a wafer treatment device 110 having a vapor chamber 112. Wafer treatment device 110 also includes an upper electrode assembly 120 disposed at a top portion of wafer treatment device 110.

Upper electrode assembly 120 is configured to supply treatment gas into vapor chamber 112. Upper electrode assembly 120 includes a gas distribution plate 122 having a plurality of holes 124. Upper electrode assembly 120 further includes an upper electrode 126 having at least one gas nozzle 128 and at least one controllable valve 129. Each gas nozzle 128 is connected to a corresponding controllable valve 129. In some embodiments, controllable valve 129 comprises a gate valve, a globe valve, a pinch valve, a diaphragm valve, a needle valve or another suitable valve. The at least one gas nozzle 128 is configured to conduct treatment gas to the plurality of holes 124.

Wafer treatment device 110 further includes a wafer support assembly 130 disposed at a base portion of wafer treatment assembly 110. Wafer support assembly 130 supports a wafer W inside vapor chamber 112 to expose wafer W to treatment gas emitted from holes 124.

Wafer treatment device 110 further includes a gas supply 140 configured to store a volume of treatment gas. Gas supply 140 is connected via a gas inlet 142 to a gas chamber 144. Gas chamber 144 is connected to the at least one gas nozzle 128 to supply gas to vapor chamber 112.

Plasma treatment apparatus 100 further includes a controller 150 configured to generate a control signal to cause adjustment of controllable valves 129. Controller 150 is connected to wafer treatment device 110 by a wired or wireless connection.

Controlling controllable valves 129 individually allows plasma treatment apparatus 100 to control asymmetric flow of the treatment gas within vapor chamber 112, which helps increase uniformity of an exposed surface of wafer W. Uniformity is determined based on gradients of variables such as thickness, critical dimension, layer composition, etc. If the gradient of a variable across the exposed surface of wafer W is small, the uniformity is high. Uniformity is increased by selective opening and closing controllable valves 129 to more evenly distribute the treatment gas within vapor chamber 112. As uniformity of the exposed surface of wafer W increases, production yield also increases because more dies formed on the exposed surface pass quality control tests.

In some embodiments, a discharge direction of at least one gas nozzle 128 is adjustable. In some embodiments, the discharge direction is adjustable in two dimensions parallel to a plane of a bottom surface of upper electrode 126. In some embodiments, an actuator is connected to each gas nozzle 128 to adjust the discharge direction of gas nozzle 128. In some embodiments, controller 150 is connected to the actuator to control the discharge direction of at least one gas nozzle 128. In some embodiments, a separate controller, different from controller 150, is connected to the actuator to control the discharge direction of the at least one gas nozzle 128. Controlling the discharge direction of the at least one gas nozzle 128 controls the distribution of treatment gas within vapor chamber 112, thereby facilitating asymmetric flow of treatment gas.

In some embodiments, plasma treatment apparatus 100 is configured for etching a pattern into wafer W. In some embodiments, plasma treatment apparatus 100 is configured for depositing a layer onto wafer W. Asymmetric flow of treatment gas within vapor chamber 112 increases the precision of each process. Asymmetric flow of treatment gas in vapor chamber 112, increases uniformity of an amount of etching at each location across the exposed surface of wafer W. Similarly, asymmetric flow of treatment gas in vapor chamber 112 results in a deposited layer having a uniform thickness across the exposed surface of wafer W. A high level of uniformity across the exposed surface of wafer W increases a number of usable dies formed on wafer W. For example, in flip chip bonding processes, bonding pads or pillars having poor height or size uniformity often results in insufficient bonding and a failed device.

Figure 2:
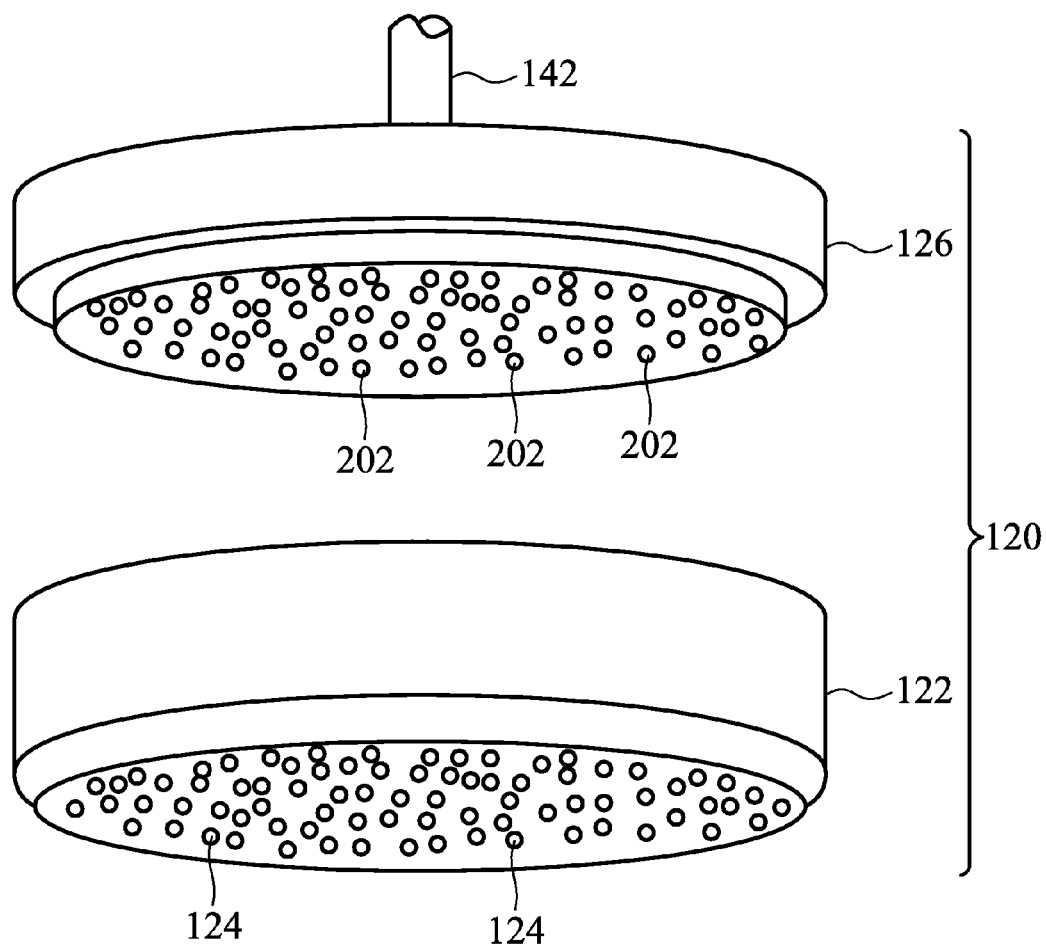
FIG. 2 is an exploded perspective view of an upper electrode assembly in accordance with at least one embodiment.

FIG. 2 is an exploded perspective view of upper electrode 120 in accordance with some embodiments. Discharge ports 202 are in the bottom surface of upper electrode 126. Discharge treatment gas is emitted into vapor chamber 112 through holes 124. In some embodiments, discharge ports 202 are aligned with holes 124. In some embodiments, discharge ports 202 are not aligned with holes 124.

In some embodiments, gas distribution plate 122 is bonded to a lower major surface of upper electrode 126. In some embodiments, bonding of gas distribution plate 122 to upper electrode 126 is accomplished using a silicone-based adhesive having different types of fillers tailored for enhancing thermal conductivity. In some embodiments, a gap remains between gas distribution plate 122 and upper electrode 126 following bonding. The gap helps to compensate for misalignment between discharge ports 202 and holes 124. The gap also facilitates changing the discharge direction of at least one gas nozzle 128 by allowing the gas nozzle 128 to direct flow toward specific holes 124.

Figure 3:
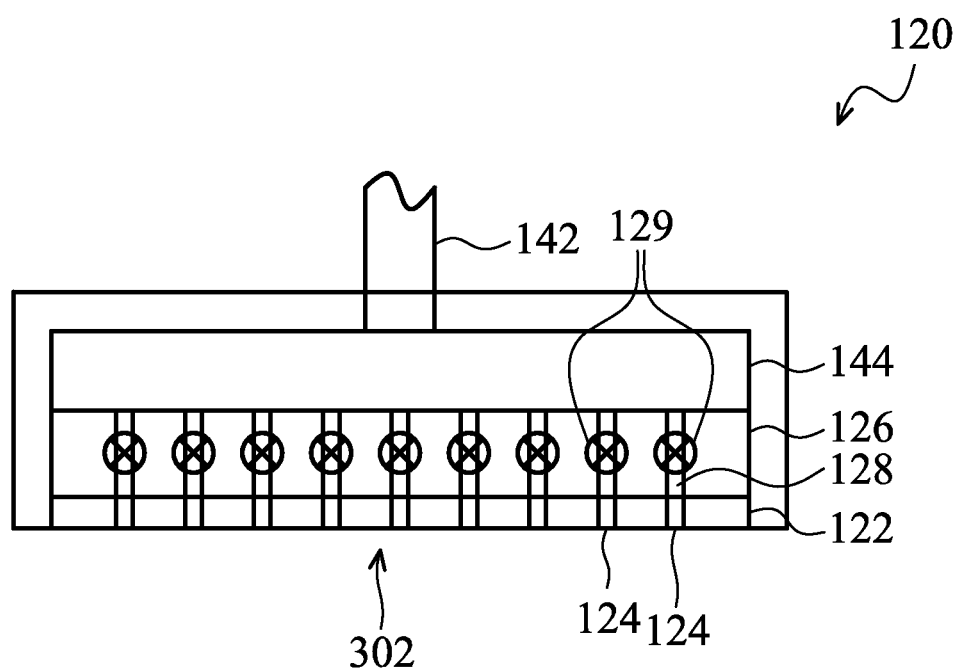
FIG. 3 is a cross sectional view of the upper electrode assembly in accordance with at least one embodiment.

FIG. 3 is a cross-sectional view of upper electrode assembly 120. Treatment gas from gas supply 140 enters upper electrode assembly 120 through gas inlet 142. The treatment gas is dispersed in gas chamber 144. Gas chamber 144 enables distribution of the treatment gas to each gas nozzle 128 within upper electrode assembly 120. In operation, controllable valves 129 regulate flow of the treatment gas through individual gas nozzles 128. For example, by partially closing controllable valves 129 for gas nozzles 128 located near a central portion 302 of upper electrode assembly 120, a larger volume of treatment gas flows through peripherally located gas nozzles 128. Thus, by individually controlling gas flow through each gas nozzle 128, an asymmetric flow of treatment gas is produced within vapor chamber 112.

Figure 4A:
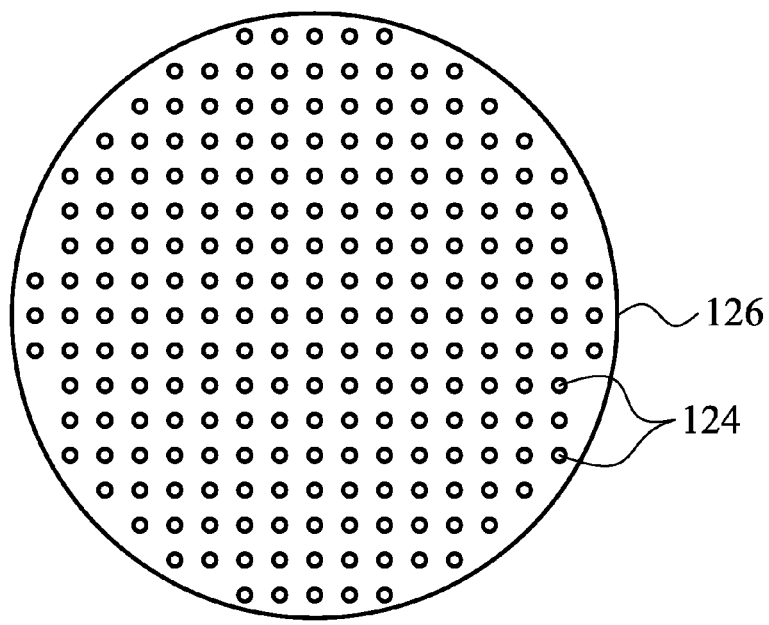
FIGS. 4A-D are bottom views of various gas distribution plates for the upper electrode assembly in accordance with at least one embodiment.

FIGS. 4A-D are bottom views of various gas distribution plates 122 for the upper electrode assembly 120 in accordance with at least one embodiment. In the embodiment of FIG. 4A, holes 124 are arranged in a regular lattice structure. Adjacent holes 124 across a bottom surface of gas distribution plate are separated by a regular distance.

Figure 4B:
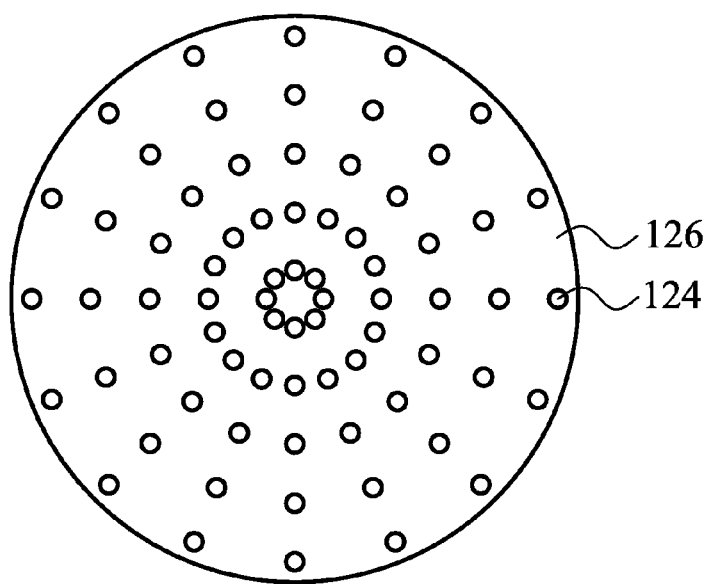

In the embodiment of FIG. 4B, holes 124 are arranged in a radial pattern. Holes 124 are spaced along lines extending from a center of gas distribution plate 126 to an outer edge of the gas distribution plate. A spacing between holes 124 of adjacent lines increases as a distance from the center of gas distribution plate 126 increases.

Figure 4C:
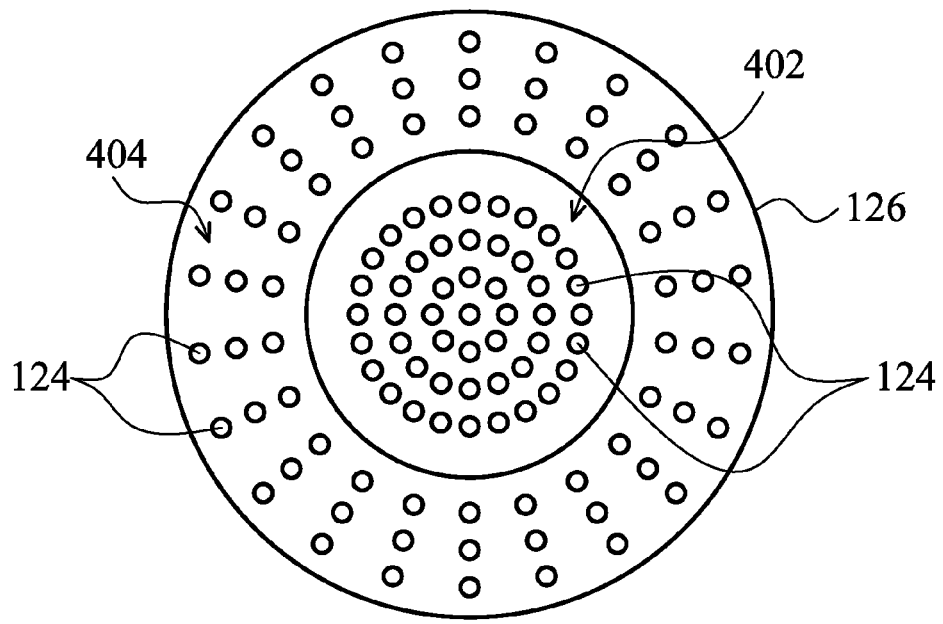

In the embodiment of FIG. 4C, holes 124 are arranged in an inner pattern 402 and an outer pattern 404. Inner pattern 402 is a concentric pattern having holes 124 arranged in concentric rings around the center of gas distribution plate 126. Outer pattern 404 is a radial pattern with holes spaced along lines extending toward the center of gas distribution plate 126.

Figure 4D:
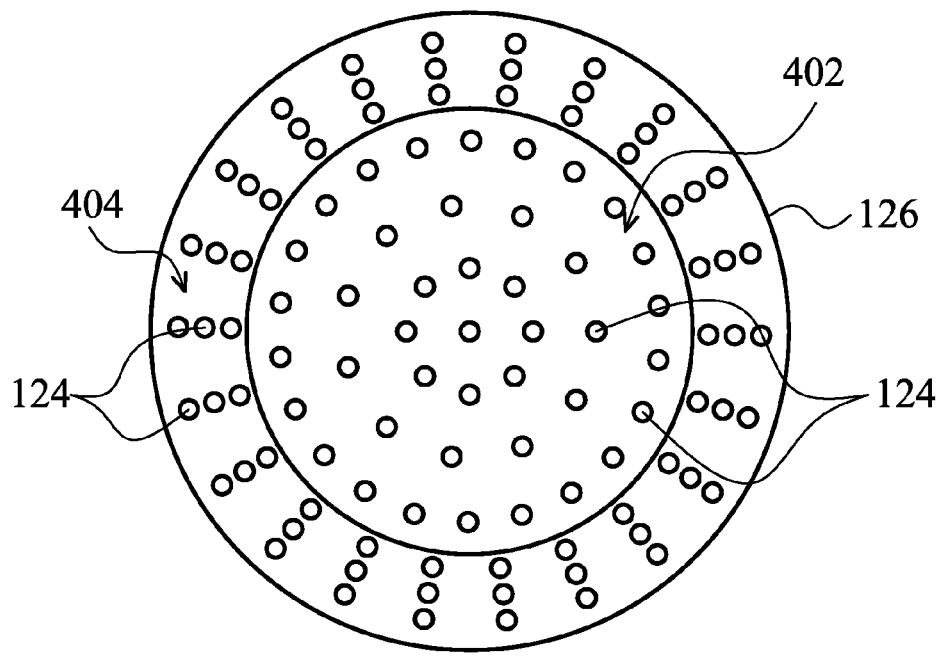

In the embodiment of FIG. 4D, holes 124 are arranged in inner pattern 402 and outer pattern 404. Inner pattern 402 is a concentric pattern having holes 124 arranged in concentric rings around the center of gas distribution plate 126. Outer pattern 404 is a radial pattern with holes spaced along lines extending toward the center of gas distribution plate 126. In contrast with FIG. 4C, inner pattern 402 of FIG. 4D covers a larger surface area of gas distribution plate 126. Also, spacing between concentric rings of inner pattern 402 is larger in FIG. 4D than in FIG. 4C.

In some embodiments, gas distribution plate 126 has one pattern of holes 124 across the bottom surface of the gas distribution plate. In some embodiments, gas distribution plate 126 has more than one pattern of holes across the bottom surface of the gas distribution plate. In some embodiments, spacing between holes 124 on the bottom surface of gas distribution plate 126 is irregular. In some embodiments, gas distribution plate 126 has a different pattern of holes 124.

Figure 5:
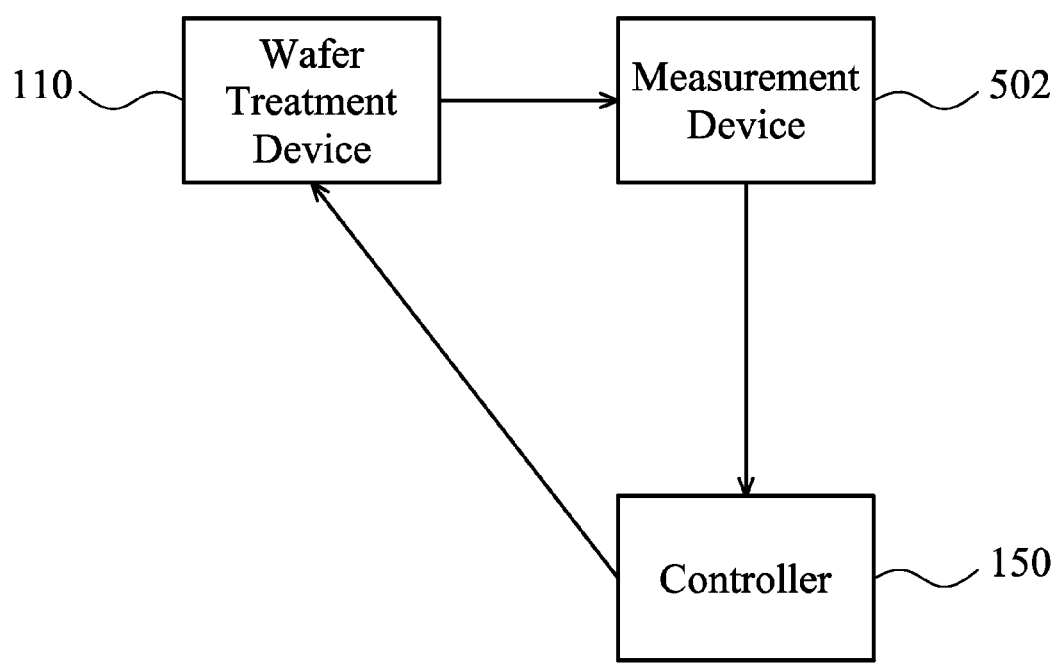
FIG. 5 is a block diagram of a feedback control system in accordance with at least one embodiment.

FIG. 5 is a block diagram of a feedback control system 500 in accordance with at least one embodiment. Feedback control system 500 includes wafer treatment device 110, controller 150 and a measurement device 502. Measurement device 502 is configured to measure a thickness profile of wafer W and transmit the thickness measurement to controller 150. Controller 150 is configured to receive the thickness measurement and generate a control signal based on the thickness measurement. The control signal is transmitted to wafer treatment device 110 to adjust controllable valves 129. In some embodiments, controller 150 generates one control signal for each controllable valve 129. In some embodiments, controller 150 generates a number of control signals different than the number of controllable valves 129 and circuitry in wafer treatment device 110 routes the control signals to controllable valves 129.

In operation, wafer treatment device 110 treats wafer W. In some embodiments, wafer W is subjected to an etching process. In some embodiments, a layer is deposited on wafer W. Following treatment of wafer W, wafer W is transferred to measurement device 502.

The thickness profile of wafer W is measured using measurement device 502. In some embodiments, measurement device 502 is a metrology tool. In some embodiments, measurement device 502 uses Fourier transform infrared (FTIR) spectroscopy to measure wafer W. After the FTIR data is obtained, the thickness profile of wafer W is calculated using Beer's Law or Snell's Law. In some embodiments, measurement device 502 is a NOVA® 3090, a KLA-TENCOR® FX100 or other suitable metrology tool.

After the thickness profile of wafer W is measured, the thickness measurement is transmitted to controller 150. In some embodiments, the thickness measurement is transmitted using a wired connection. In some embodiments, the thickness measurement is transmitted using a wireless connection. Controller 150 is configured to receive the thickness measurement and generate the control signal based on the thickness measurement.

Figure 6:
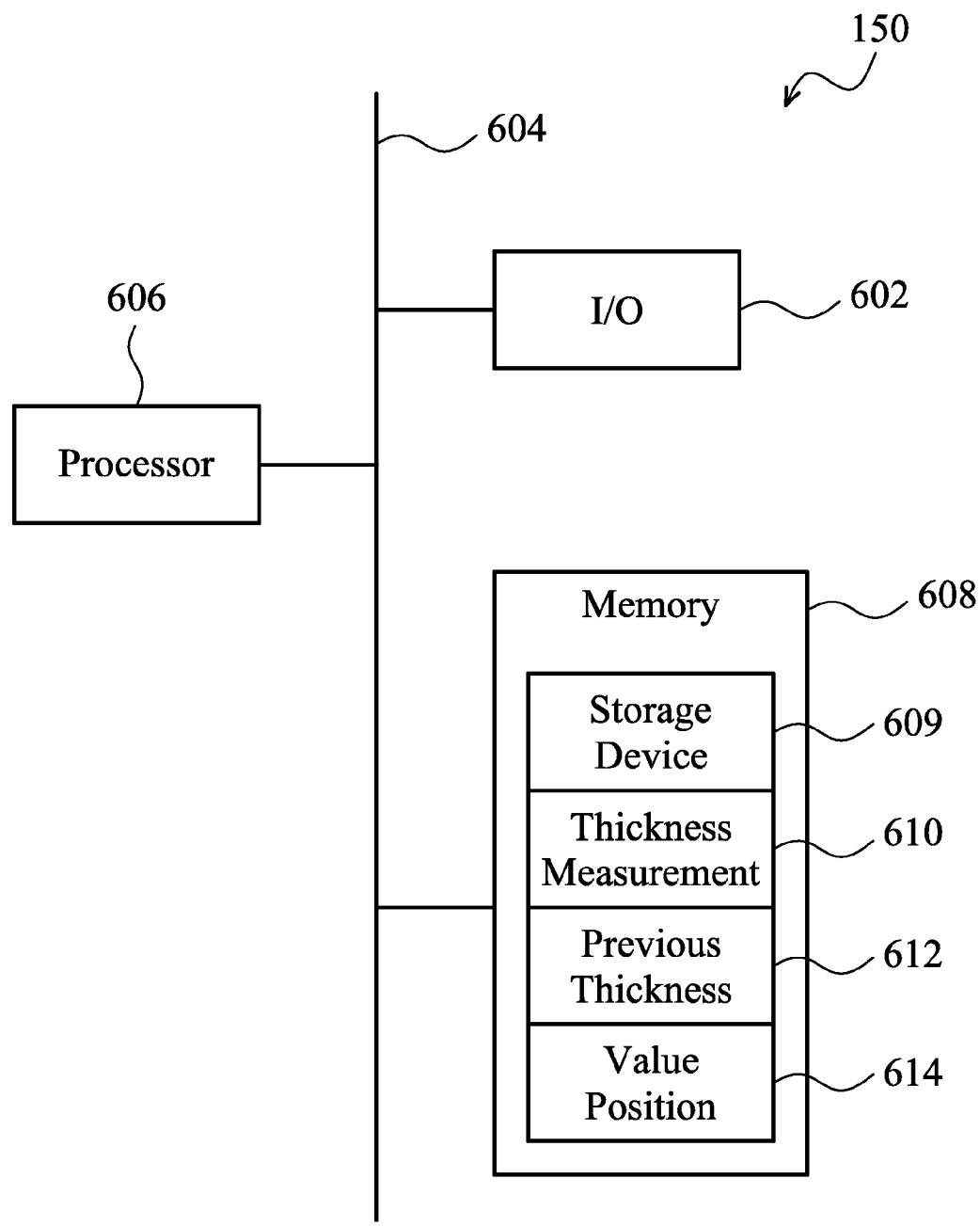
FIG. 6 is a schematic diagram of a controller of the plasma treatment apparatus in accordance with at least one embodiment.

FIG. 6 is a schematic diagram of controller 150 in accordance with at least one embodiment. Controller 150 includes an input/output (I/O) device 602 configured to receive/transmit signals from/to devices external to controller 150. I/O device 602 is connected to a processor 606 by a bus line 604. Processor 606 is configured to calculate values based on information received from I/O device 602 and information stored in a memory 608. Memory 608 is connected to I/O device 602 and processor 606 by bus line 604. Memory 608 includes a storage device 609.

Memory 608 comprises, in some embodiments, a random access memory (RAM) and/or other dynamic storage device and/or read only memory (ROM) and/or other static storage device, coupled to bus 604 for storing data and instructions to be executed by processor 606. Memory 608 is also used, in some embodiments, for storing temporary variables or other intermediate information during execution of instructions to be executed by processor 606.

Storage device 609, such as a magnetic disk or optical disk, is provided, in some embodiments, and coupled to bus 604 for storing data and/or instructions. I/O device 602 comprises an input device, an output device and/or a combined input/output device for enabling user interaction with controller 150. An input device comprises, for example, a keyboard, keypad, mouse, trackball, trackpad, and/or cursor direction keys for communicating information and commands to the processor 606. An output device comprises, for example, a display, a printer, a voice synthesizer, etc. for communicating information to a user.

In some embodiments, the generation of the control signal is realized by a processor, e.g., processor 606, which is programmed for performing such processes. One or more of the memory 608, storage device 609, I/O device 602, and bus 604 is/are operable to receive design rules and/or other parameters for processing by processor 606. One or more of memory 608, storage 609, I/O device 602, and bus 604 is/are operable to output the control signal as determined by processor 606.

In some embodiments, one or more of the processes is/are performed by specifically configured hardware (e.g., by one or more application specific integrated circuits or ASIC(s)) which is/are provided) separate from or in lieu of the processor. Some embodiments incorporate more than one of the described processes in a single ASIC.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In some embodiments, storage device 609 is configured to store at least one value related to the thickness measurement 610, a previous thickness measurement 612 and a valve position 614. In some embodiments, storage device 609 stores a separate value for the valve position of each controllable valve 129. In some embodiments, storage device 609 is configured to store values for different or additional variables.

Returning to FIG. 5, controller 150 generates the control signal based on the thickness measurement, the previous thickness measurement and the valve position and transmits the control signal to wafer treatment device 110. At least one controllable valve 129 of wafer treatment device 110 are at least partially opened or closed based on the control signal. A second wafer is then treated using wafer treatment device 110. A thickness profile of the second wafer is measured and another control signal is generated based on the thickness measurement.

In some embodiments, the control signal is generated following treatment of each wafer W. In some embodiments, by generating the control signal following the polishing of each wafer W, the number of wafers W that pass quality control testing for a given batch is increasable as compared to less frequency generating of the control signal.

Further, a treatment environment of wafer treatment device 110 is changeable over time due to factors such as deposits forming on walls of vapor chamber 112, variations in treatment gas pressure or concentration, or wear of the controllable valves 129.

In some embodiments, the control signal is generated based on a predefined number of wafers W treated since a previous generation of the control signal, or after a predefined elapsed time. In some embodiments, the predefined number of wafer W ranges from about 10 to about 30. In some embodiments, the predefined elapsed time ranges from about 2 minutes to about 30 minutes. By generating the control signal periodically, an overall processing speed is increasable as compared to more frequent generation of the control signal.

Figure 7:
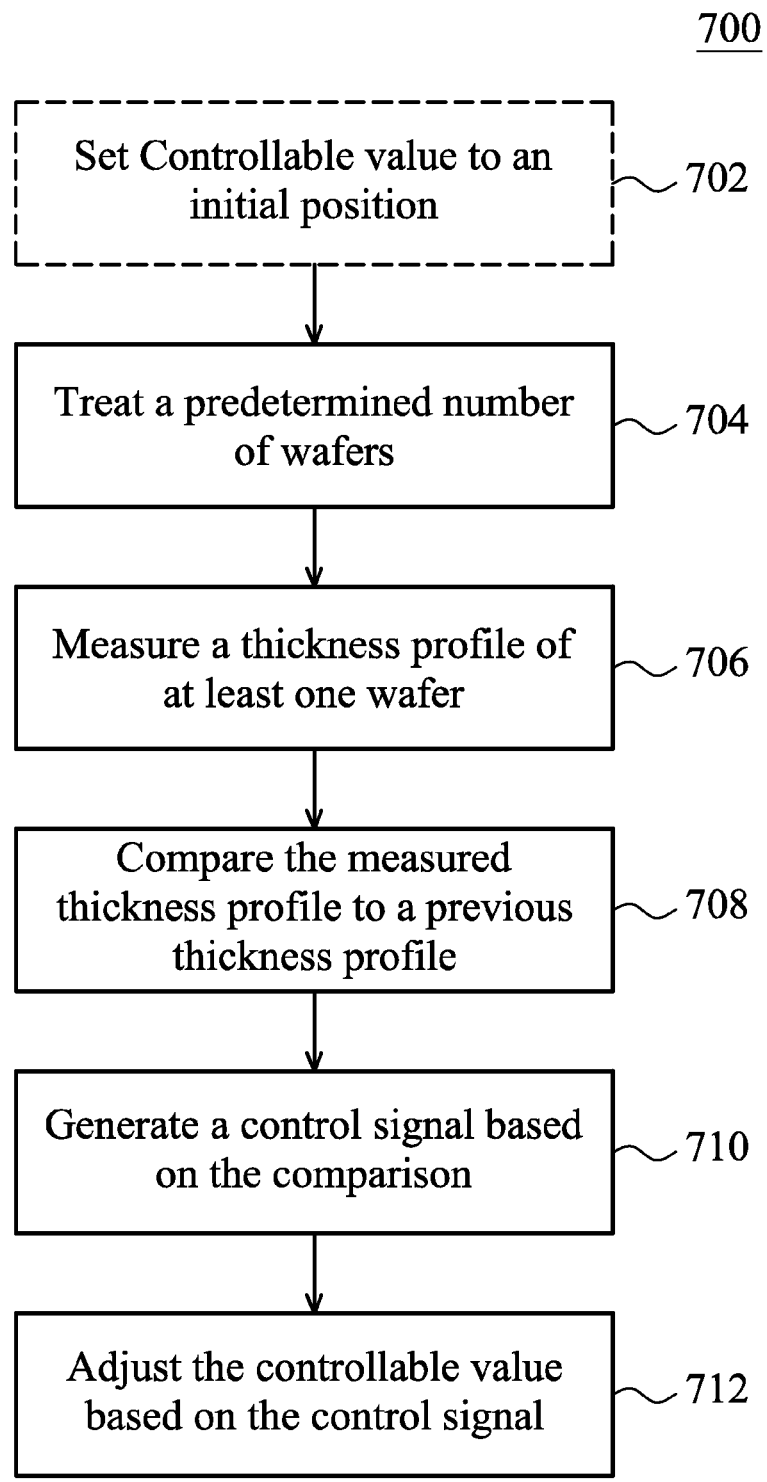
FIG. 7 is a flowchart of a method for controlling a controllable valve of an upper electrode assembly in accordance with at least one embodiment.

FIG. 7 is a flowchart of a method 700 of controlling one controllable valve 129 of an upper electrode assembly 120 in accordance with at least one embodiment. In optional operation 702, controllable valve 129 is set to an initial position. In some embodiments, the initial position is a default position. In some embodiments, the initial position is a position set using the control signal from a previous wafer treatment process. In some embodiments, controllable valve 129 is set to the initial position using a setting signal from controller 150. In some embodiments, controllable valve 129 is set to the initial position based on a user input.

In operation 704, a predetermined number of wafers are treated. The wafers are treated using wafer treatment device 110. In some embodiments, the wafers are subjected to an etching process. In some embodiments, the wafers are subjected to a deposition process. In some embodiments, the predetermined number of wafers is one. In some embodiments, the predetermined number of wafers is more than one.

In operation 706, a thickness profile of at least one wafer is measured. The thickness profile is measured using measurement device 502. In some embodiments, the thickness profile of a single wafer is measured. In some embodiments, the thickness profile for more than one wafer is measured. By measuring the thickness profile of the single wafer, the overall processing speed is increased as compared to measuring the thickness profile for more than one wafer. By measuring the thickness profile for more than one wafer, a more accurate control signal is generated as compared to measuring the thickness profile of the single wafer.

In operation 708, the thickness profile is compared to the previous thickness profile. The previous thickness profile is stored in controller 150. The comparison is performed by the controller 150.

In operation 710, a control signal is generated based on the comparison results. Controller 150 generates the control signal based on the comparison results and transmits the control signal to wafer treatment device 110.

In operation 712, controllable valve 129 is adjusted based on the control signal. Circuitry within wafer treatment device 110 routes the control signal to controllable valve 129 to adjust controllable valve 129. In some embodiments, controllable valves 129 are controlled using motors, piezoelectric actuators or other suitable actuators.

One aspect of this description relates to a plasma treatment apparatus including a vapor chamber, a gas supply and an upper electrode assembly. The upper electrode assembly includes a gas distribution plate having a plurality of holes in a bottom surface thereof and an upper electrode having at least one gas nozzle and at least one controllable valve connected to the at least one gas nozzle. The plasma treatment apparatus further includes a controller configured to generate a control signal. The at least one controllable valve is configured to be adjusted based on the control signal.

Another aspect of this description relates to control system for a plasma treatment apparatus including a wafer treatment device, a measurement device and a controller. The wafer treatment device includes a vapor chamber, a gas supply, a wafer support assembly configured to support a wafer within the vapor chamber and an upper electrode assembly. The upper electrode assembly includes a gas distribution plate having a plurality of holes in a bottom surface thereof and an upper electrode having at least one gas nozzle and at least one controllable valve connected to the at least one gas nozzle. The measurement device is configured to measure a thickness profile of a wafer. The controller is configured to generate a control signal. The at least one controllable valve is configured to be adjusted based on the control signal.

Another aspect of this description relates to a method of controlling a controllable valve of a plasma treatment apparatus. The method includes treating a predetermined number of wafers and measuring a thickness profile of at least one wafer of the predetermined number of wafers. The method further includes comparing the measured thickness profile to a previous thickness profile and generating a control signal based on the comparison. The method further includes adjusting the controllable valve based on the control signal.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A plasma treatment apparatus comprising:
   a vapor chamber;
   an upper electrode assembly comprising:
      a gas distribution plate having a plurality of holes in a bottom surface thereof; and
      an upper electrode having at least one gas nozzle and at least one controllable valve connected to the at least one gas nozzle for controlling a flow of gas from a gas supply to the holes via the at least one gas nozzle, the at least one gas nozzle is an adjustable nozzle, and the at least one gas nozzle is separated from the gas distribution plate by a gap;
   a measurement device configured to measure a thickness profile of a wafer; and
   a controller configured to generate a control signal for processing a subsequent wafer based on the measured thickness profile,
   wherein the at least one controllable valve is configured to be adjusted based on the control signal.

2. The plasma treatment apparatus of claim 1, wherein the upper electrode has a plurality of gas nozzles, and
   each of the plurality of gas nozzles is connected to a corresponding controllable valve.

3. The plasma treatment apparatus of claim 1, wherein the plurality of holes are arranged in at least one pattern across the bottom surface of the gas distribution plate.

4. The plasma treatment apparatus of claim 1, when the plurality of holes are arranged in a first pattern proximate a center of the bottom surface of the gas distribution plate and a second pattern surrounding the first pattern, and the first pattern is different from the second pattern.

5. The plasma treatment apparatus of claim 1, further including a wafer support assembly configured to support a wafer within the vapor chamber.

6. The plasma treatment apparatus of claim 1, further comprising:
   a gas inlet; and
   a gas chamber connected to the at least one gas nozzle,
   wherein the gas inlet is configured to conduct gas from the gas supply to the gas chamber.

7. The plasma treatment apparatus of claim 1, wherein the upper electrode assembly further comprises a gap between the upper electrode and the gas distribution plate.

8. A plasma treatment apparatus comprising:
   a wafer treatment device, the wafer treatment device comprising:
      a vapor chamber; and
      an upper electrode assembly comprising:
         a gas distribution plate having a plurality of holes in a bottom surface thereof; and
         an upper electrode having at least one gas nozzle and at least one controllable valve connected to the at least one gas nozzle for controlling a flow of gas from a gas supply to the holes via the at least one gas nozzle, the at least one gas nozzle is an adjustable nozzle, and the at least one gas nozzle is separated from the gas distribution plate by a gap; and
   a control system connected to the wafer treatment device, the control system comprising:
      a measurement device configured to measure a thickness profile of a wafer; and
      a controller configured to generate a control signal for processing a subsequent wafer based on the measured thickness profile,
   wherein the at least one controllable valve is configured to be adjusted based on the control signal.

9. The plasma treatment apparatus of claim 8, wherein the measurement device is configured to transmit the measured thickness profile to the controller.

10. The plasma treatment apparatus of claim 8, wherein the plurality of holes are arranged in at least one pattern across the bottom surface of the gas distribution plate.

11. The plasma treatment apparatus of claim 8, when the plurality of holes are arranged in a first pattern proximate a center of the bottom surface of the gas distribution plate and a second pattern surrounding the first pattern, and the first pattern and the second pattern are different.

12. The plasma treatment apparatus of claim 8, wherein the upper electrode assembly further comprises a gap between the upper electrode and the gas distribution plate.

13. The plasma treatment apparatus of claim 8, wherein the gas distribution plate is between the vapor chamber and the at least one gas nozzle.

14. The plasma treatment apparatus of claim 8, wherein each hole of the plurality of holes is offset with respect to a discharge port of the at least one gas nozzle.

15. A plasma treatment apparatus comprising:
a vapor chamber;
an upper electrode assembly comprising:
    a gas distribution plate having a plurality of holes in a bottom surface thereof; and
    an upper electrode having a plurality of gas nozzles and a controllable valve connected to each corresponding gas nozzle of the plurality of gas nozzles for controlling a flow of gas from a gas supply to the holes via each gas nozzle of the plurality of gas nozzles, wherein a discharge direction of at least one gas nozzle of the plurality of gas nozzles is adjustable, and the at least one gas nozzle is separated from the gas distribution plate by a gap;
a measurement device configured to measure a thickness profile of a wafer; and
a controller configured to generate a control signal for processing a subsequent wafer based on the measured thickness profile,
wherein each gas nozzle of the plurality of gas nozzles is configured to be adjusted based on the control signal.

16. The plasma treatment apparatus of claim 15, wherein the plurality of holes in the gas distribution plate are arranged in a regular lattice pattern.

17. The plasma treatment apparatus of claim 15, wherein the plurality of holes in the gas distribution plate are arranged in a radial pattern.

18. The plasma treatment apparatus of claim 15, wherein the plurality of holes in the gas distribution plate are arranged in an inner pattern and an outer pattern different from the inner pattern, and the inner pattern is located closer to a center of the gas distribution plate than the outer pattern.

19. The plasma treatment apparatus of claim 18, wherein the inner pattern is a concentric pattern, and the outer pattern is a radial pattern.

20. The plasma treatment apparatus of claim 15, wherein a spacing between adjacent holes of the plurality of holes is irregular.

* * * * *